US011728669B2

United States Patent
Okabayashi et al.

(10) Patent No.: US 11,728,669 B2
(45) Date of Patent: Aug. 15, 2023

(54) CHARGER

(71) Applicant: MAKITA CORPORATION, Anjo (JP)

(72) Inventors: Hisakazu Okabayashi, Anjo (JP); Masaya Mizutani, Anjo (JP)

(73) Assignee: MAKITA CORPORATION, Anjo (JP)

( * ) Notice: Subject to any disclaimer, the term of this patent is extended or adjusted under 35 U.S.C. 154(b) by 163 days.

(21) Appl. No.: 17/472,921

(22) Filed: Sep. 13, 2021

(65) Prior Publication Data
US 2022/0085640 A1 Mar. 17, 2022

(30) Foreign Application Priority Data

Sep. 14, 2020 (JP) ................. 2020-153617

(51) Int. Cl.
*H01M 10/44* (2006.01)
*H02J 7/00* (2006.01)
*G01R 31/36* (2020.01)

(52) U.S. Cl.
CPC .... *H02J 7/007194* (2020.01); *G01R 31/3648* (2013.01); *H02J 7/0044* (2013.01); *H02J 7/0045* (2013.01); *H02J 7/0047* (2013.01)

(58) Field of Classification Search
CPC ............. G01R 31/3648; H01M 10/443; H02J 7/0047; H02J 7/0044; H02J 7/0045; H02J 7/04; H02J 7/007192; H02J 7/00309; H02J 7/007194
USPC ........ 320/107, 114, 132, 134, 136, 150, 153
See application file for complete search history.

(56) References Cited

U.S. PATENT DOCUMENTS

| 7,064,523 B2* | 6/2006 | Aradachi | H02J 7/007194 320/150 |
| 2004/0145349 A1* | 7/2004 | Mori | H02M 3/33507 320/128 |
| 2006/0186860 A1 | 8/2006 | Mori | |
| 2010/0176768 A1* | 7/2010 | Kimura | H01M 10/443 320/152 |
| 2018/0278071 A1* | 9/2018 | Murakami | H02J 7/00047 |
| 2018/0316200 A1* | 11/2018 | Yen | H01M 10/425 |

FOREIGN PATENT DOCUMENTS

JP 3983681 B2 9/2007

* cited by examiner

*Primary Examiner* — Edward Tso
(74) *Attorney, Agent, or Firm* — Oliff PLC

(57) ABSTRACT

A charger includes a first connection portion, a second connection portion, a power-supply circuit, an integration circuit, a storage device, a first calculation circuit, a threshold setting circuit, a detection circuit, and a reduction circuit. The power-supply circuit includes a heat-generating component. At a start of charging a battery, the first calculation circuit calculates a first detection threshold candidate based on a first correspondence data (or a first correlation data). The first detection threshold candidate corresponds to a first temperature threshold that is calculated, with a calculated integrated capacity assigned to a battery capacity, based on the first correspondence data. The threshold setting circuit sets the first detection threshold candidate as a detection threshold. The reduction circuit performs reduction of a charging current value in response to a detected temperature of the heat-generating component having become higher than or equal to the detection threshold.

10 Claims, 9 Drawing Sheets

CHARGER

CROSS-REFERENCE TO RELATED APPLICATIONS

This application claims the benefit of Japanese Patent Application No. 2020-153617 filed on Sep. 14, 2020 with the Japan Patent Office, the disclosure of which is incorporated herein by reference.

BACKGROUND

The present disclosure relates to a charger.

A charger disclosed in the publication of Japanese Patent No. 3983681 is configured such that a temperature of a specified component therein is detected and reduction of a charging current is performed in response to the detected temperature having reached a fixed component temperature threshold.

SUMMARY

The charger includes two or more heat-generating components. The two or more heat-generating components have tendencies of temperature rise different from each other. However, it is difficult to provide a temperature detector to each of the two or more heat-generating components for design reasons of the charger. Thus, the temperature detector is provided to one of the two or more heat-generating components. As a result, if the fixed component temperature threshold is used, even when the detected temperature is lower than the component temperature threshold, the temperature of another component may be beyond the component temperature threshold. This may lead to occurrence of a situation in which the charger cannot be protected properly.

It is desirable that one aspect of the present disclosure be able to provide a charger that can be protected properly.

A charger according to one aspect of the present disclosure includes a first connection portion, a second connection portion, a power-supply circuit, an integration circuit, a storage device, a first calculation circuit, a threshold setting circuit, a detection circuit, and a reduction circuit. The first connection portion is connected to an external power supply. The external power supply outputs a first electric power. The second connection portion is connected to a battery. The power-supply circuit includes a heat-generating component. The power-supply circuit generates a second electric power from the first electric power inputted through the first connection portion, and outputs the second electric power through the second connection portion. The integration circuit calculates an integrated capacity during a period in which the first connection portion is electrically connected to the external power supply. The integrated capacity corresponds to a value obtained by integrating an amount of current into a predetermined initial value. The amount of current is based on a value of a charging current outputted from the second connection portion. The storage device stores a first correspondence data (or a first correlation data). The first correspondence data indicates a correspondence relationship (or a correlation) between a battery capacity and a first temperature threshold. At a start of charging the battery, the first calculation circuit calculates a first detection threshold candidate (or a first candidate for detection threshold, or a first detection threshold option, or a first detection threshold choice, or a first prospective detection threshold) based on the first correspondence data stored in the storage device. The first detection threshold candidate corresponds to the first temperature threshold that is calculated, with the integrated capacity assigned to the battery capacity, based on the first correspondence data. At the start of charging the battery, the threshold setting circuit sets a detection threshold to the first detection threshold candidate calculated by the first calculation circuit. The detection circuit detects a temperature of the heat-generating component. The reduction circuit performs reduction of the charging current value in response to the temperature detected by the detection circuit having become higher than or equal to the detection threshold set by the threshold setting circuit. In a charger according to another aspect, any of the first connection portion, the second connection portion, the power-supply circuit, the heat-generating component, the integration circuit, the storage device, the first calculation circuit, the threshold setting circuit, the detection circuit, and the reduction circuit may be excluded.

In the charger according to one aspect of the present disclosure, the amount of current is integrated to calculate the integrated capacity, during a period in which the charger is electrically connected to the external power supply. In a case where the charger has charged two or more batteries sequentially, the calculated integrated capacity corresponds to a value obtained by integrating amounts of current supplied to the two or more batteries. The temperature of the heat-generating component rises to the same extent as when a battery having the same capacity as the integrated capacity has been charged. Thus, the integrated capacity properly indicates a temperature state of the heat-generating component. By setting the detection threshold based on such an integrated capacity and the first correspondence data, the detection threshold can be set according to the temperature state of the heat-generating component. For example, the charger may include the heat-generating component, which is a detection target as to temperature, and a first component, the temperature of which may become higher than that of the detection target. In such a case, it is possible to estimate the temperature of the first component from the integrated capacity, and to set the detection threshold such that the temperature of the heat-generating component reaches the detection threshold before the temperature of the first component exceeds a permissible temperature. The permissible temperature is an upper limit of the temperature at which operation of the component is guaranteed. Moreover, in the case where the detected temperature of the heat-generating component has reached the set detection threshold, the charger can be properly protected by reducing the charging current value.

The integration circuit may subtract a specified value from an integrated value in response to a value of the charging current being smaller than a current threshold during a period in which the first connection portion is electrically connected to the external power supply.

In response to the charging current value being smaller than the current threshold, the heat-generating component radiates heat, thus lowering the temperature of the heat-generating component. Thus, during the period in which the first connection portion is electrically connected to the external power supply, the specified value is subtracted from the integrated value in response to the charging current value being smaller than the current threshold. This makes it possible to calculate the integrated capacity that indicates the temperature state of the charger more properly.

The battery may have a nominal capacity. This charger may further include a capacity acquisition circuit and a second calculation circuit. The capacity acquisition circuit may acquire a capacity data indicating the nominal capacity. The second calculation circuit may calculate a second detection threshold candidate (or a second candidate for detection threshold, or a second detection threshold option, or a second detection threshold choice, or a second prospective detection threshold) based on the first correspondence data stored in the storage device. The second detection threshold candidate corresponds to the first temperature threshold that is calculated, with the capacity data assigned to the battery capacity, based on the first correspondence data. The threshold setting circuit may set the detection threshold to the first detection threshold candidate or the second detection threshold candidate, whichever is smaller. In a charger according to yet another aspect, either the capacity acquisition circuit or the second calculation circuit may be excluded.

The first detection threshold candidate or the second detection threshold candidate, whichever is smaller, is set as the detection threshold. Here, in the case of charging the battery having a comparatively high capacity with a charging current of the same value as that for the battery having a comparatively low capacity, the temperature rise of the heat-generating component is gentler than in the case of charging the battery having a comparatively low capacity. However, the degree to which the temperature rise becomes gentler differs depending on the component. Such degree in the heat-generating component arranged in the vicinity of the temperature detection circuit may be larger than that in the first component arranged away from the temperature detection circuit. That is, when charging the battery having a higher capacity, the temperature of the first component may be higher than that of the heat-generating component.

If the detection threshold is set based only on the integrated capacity, when the charger charges the first battery, the detection threshold having a comparatively large value is set because the integrated capacity is small. Thus, if the capacity of the first battery is comparatively large, a situation may occur in which the temperature of the first component exceeds the permissible temperature before the temperature of the heat-generating component reaches the detection threshold, thus failing to protect the charger properly. On the other hand, if the detection threshold is set based only on the nominal capacity, the detection threshold having a comparatively large value is set when charging the battery having a comparatively low capacity. Thus, in a case of charging the battery having a comparatively low capacity after the temperature of the first component has become comparatively high due to charging of the battery having a comparatively high capacity, the charger may be unable to be protected properly. Therefore, the first detection threshold candidate or the second detection threshold candidate, whichever is smaller, is set as the detection threshold. This enables proper protection of the charger even when charging the two or more batteries in whatever order.

The storage device may further store a second correspondence data (or a second correlation data). The second correspondence data may correspond to a correspondence relationship (or a correlation) between the battery capacity and a second temperature threshold. The second temperature threshold may be smaller than the first temperature threshold. At the start of charging the battery, the first calculation circuit may further calculate a first cancel threshold candidate (or a first candidate for cancel threshold, or a first cancel threshold option, or a first cancel threshold choice, or a first prospective cancel threshold) based on the second correspondence data stored in the storage device. The first cancel threshold candidate may correspond to the second temperature threshold that is calculated, with the integrated capacity assigned to the battery capacity, based on the second correspondence data. The second calculation circuit may further calculate a second cancel threshold candidate (or a second candidate for cancel threshold, or a second cancel threshold option, or a second cancel threshold choice, or a second prospective cancel threshold) based on the second correspondence data stored in the storage device. The second cancel threshold candidate may correspond to the second temperature threshold that is calculated, with the capacity data assigned to the battery capacity, based on the second correspondence data. At the start of charging the battery, the threshold setting circuit may further set a cancel threshold to the first cancel threshold candidate or the second cancel threshold candidate, whichever is smaller. The reduction circuit may cancel the reduction of the charging current value in response to the temperature detected by the detection circuit having become lower than the cancel threshold set by the threshold setting circuit, subsequent to performing the reduction of the charging current value.

The detection threshold and the cancel threshold smaller than the detection threshold are set. This results in performing reduction of the charging current value upon the temperature having become higher than or equal to the detection threshold, and in canceling the reduction of the charging current value upon the temperature having become lower than the cancel threshold. Accordingly, reduction of the charging current value can be performed and canceled properly.

At the start of charging the battery, the reduction circuit may perform the reduction of the charging current value if the temperature detected by the detection circuit is higher than or equal to the cancel threshold set by the threshold setting circuit.

In a case of charging two batteries sequentially, a situation may occur in which reduction of the charging current value is performed when charging the first battery and, before the reduction of the charging current value is canceled, charging of the second battery is started. In such a case, in order to protect the charger it is desirable, when charging the second battery, to cancel the reduction of the charging current value after the temperature has become lower than the cancel threshold. At the start of charging the battery, by performing reduction of the charging current value when the temperature is higher than the cancel threshold, the charger can be protected properly even in the case of charging two or more batteries sequentially.

The integration circuit may calculate the integrated capacity in a process cycle. The process cycle may repeat. The amount of current may correspond to a value obtained by multiplying the charging current value at a time of calculating the integrated capacity by the process cycle. The integrated capacity can be calculated in real time.

The heat-generating component may be arranged in a vicinity of a first component. The first component may have a speed of temperature rise that depends on a magnitude of a capacity of the battery. In a case where the temperature of the first component cannot be detected directly, the temperature of the first component according to the magnitude of the capacity of the battery can be estimated from the temperature of the heat-generating component.

This charger may further include a current acquisition circuit. The current acquisition circuit may acquire a demanded current value from the battery during charging of the battery. The power-supply circuit may output, through the second connection portion, a charging current having a value based on the demanded current value acquired by the current acquisition circuit. In response to (i) the temperature detected by the detection circuit having become higher than or equal to the detection threshold set by the threshold setting circuit and (ii) the demanded current value acquired by the current acquisition circuit being larger than or equal to a reduced current value, the reduction circuit may cause a charging current of the reduced current value to be outputted.

Even when the detected temperature is higher than or equal to the detection threshold, the charging current value is not reduced in response to the demanded current value being smaller than the reduced current value. That is, even when the charger is in a state where it should be protected, if the demanded current value is comparatively small, the battery can be charged with the charging current of the demanded current value.

A method for charging a battery by a charger according to another aspect of the present disclosure includes:

receiving a first electric power from an external power supply through a first connection portion of the charger;

generating a second electric power from the first electric power;

outputting the second electric power generated, to the battery connected to a second connection portion of the charger;

calculating an integrated capacity during a period in which the first connection portion is electrically connected to the external power supply, the integrated capacity corresponding to a value obtained by integrating an amount of current into a predetermined initial value, and the amount of current being based on a value of a charging current outputted from the second connection portion;

calculating a first detection threshold candidate based on a first correspondence data, the first correspondence data (i) indicating a correspondence relationship between a battery capacity and a first temperature threshold and (ii) being stored in a storage device of the charger, the first detection threshold candidate corresponding to the first temperature threshold that is calculated, with the integrated capacity assigned to the battery capacity, based on the first correspondence data;

setting a detection threshold to the first detection threshold candidate calculated, at a start of charging the battery;

detecting a temperature of a heat-generating component included in the charger; and reducing the charging current value in response to the temperature detected having become higher than or equal to the detection threshold set.

By practicing the above-described method, effects similar to those of the above-described charger are exerted.

BRIEF DESCRIPTION OF THE DRAWINGS

An example embodiment for carrying out the present disclosure will be described below with reference to the accompanying drawings, in which.

DETAILED DESCRIPTION OF EXEMPLARY EMBODIMENTS

<1. Configuration>

First, a configuration of a charger 3 of the present embodiment will be described with reference to FIGS. 1 and 2. The charger 3 is a device to charge a battery pack 2. The battery pack 2 is attached to an electric working machine to supply electric power to the electric working machine. The capacity of the battery pack 2 may have various values. Specifically, the battery pack 2 may have a comparatively high capacity, or may have a comparatively low capacity. Examples of the electric working machine may include a power tool, a gardening tool, a light, and a cleaner. Examples of the power tool may include a laser line generator, a hammer drill, an impact driver, and a circular saw. Examples of the gardening tool may include a grass cutter, a trimmer, and a lawn mower.

Figure 1:
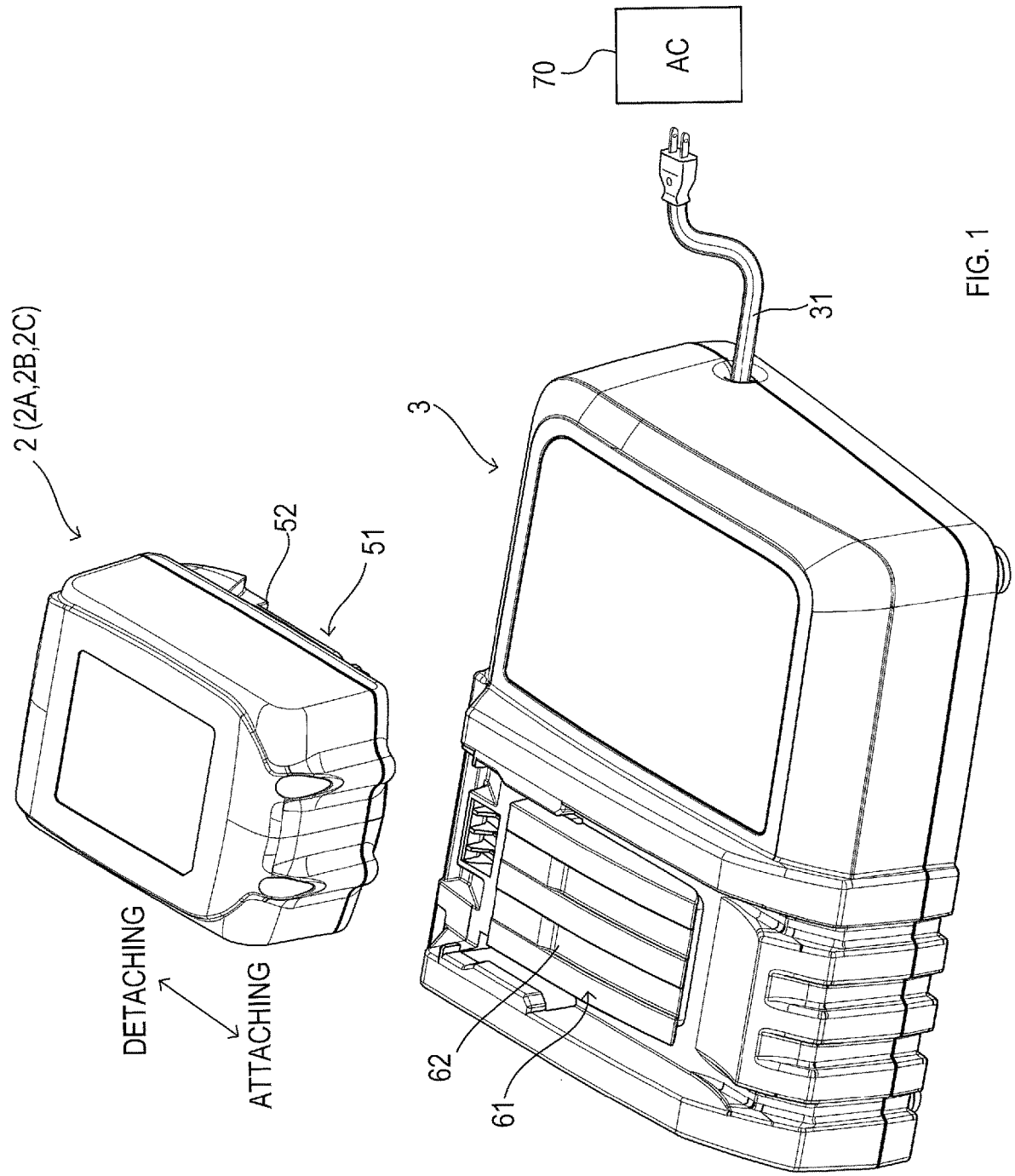
FIG. 1 is a diagram showing an external appearance of a charger and a battery pack according to the embodiment.
Figure 2:
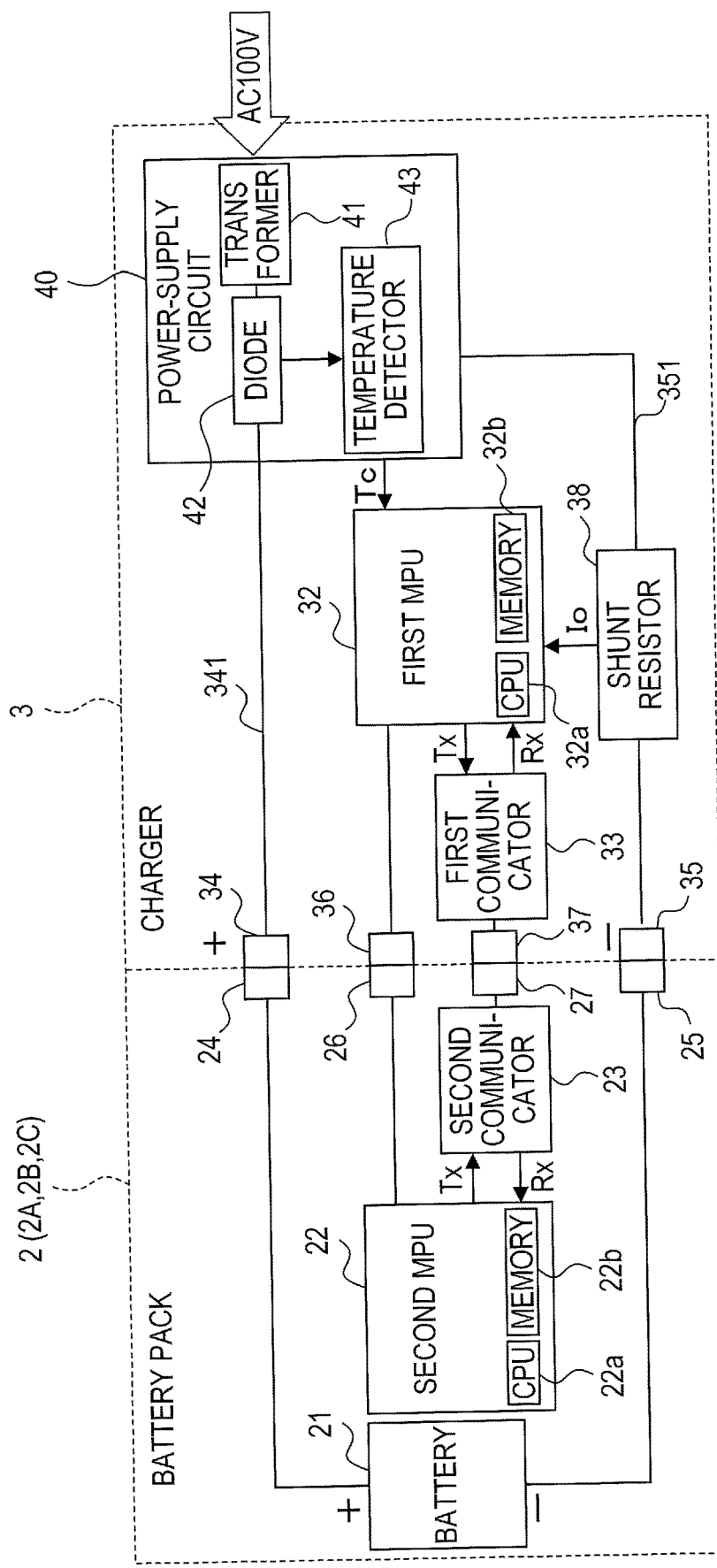
FIG. 2 is a block diagram showing an electrical configuration of the charger and the battery pack.

As shown in FIGS. 1 and 2, the charger 3 includes a first attachment portion 61, a first terminal portion 62, a power cord 31, a positive electrode line 341, and a negative electrode line 351. Any of the first attachment portion 61, the first terminal portion 62, the power cord 31, the positive electrode line 341, and the negative electrode line 351 may be excluded from the charger 3. The battery pack 2 includes a second attachment portion 51 and a second terminal portion 52. Either the second attachment portion 51 or the second terminal portion 51 may be excluded from the battery pack 2.

The charger 3 has an upper surface, and the first attachment portion 61 is provided on the upper surface of the charger 3. The first terminal portion 62 is provided to the first attachment portion 61. The battery pack 2 has a back surface, and the second attachment portion 51 is provided on the back surface of the battery pack 2. The second terminal portion 52 is provided to the second attachment portion 51, and includes plate-shaped terminals. The first attachment portion 61 is configured in a shape corresponding to a shape of the second attachment portion 51. The first terminal portion 62 includes terminals configured to mate with the plate-shaped terminals of the second terminal portion 52.

The second attachment portion 51 slides to be attached to the first attachment portion 61. Upon attachment of the second attachment portion 51 to the first attachment portion 61, the plate-shaped, terminals in the second terminal portion 52 mate with the terminals in the first terminal portion 62. This allows the battery pack 2 to be connected to the charger 3 physically and electrically.

The power cord 31 is connected to an external power supply 70. The external power supply 70 is, for example, a commercial power source of AC (100 V). From a first electric power supplied from the external power supply 70, the charger 3 generates a second electric power, and supplies the generated second electric power to the battery pack 2. The external power supply 70 is not limited to the commercial power source. The external power supply 70 may be a DC power source, such as a cigarette socket.

As shown in FIG. 2, the first terminal portion 62 includes a first positive terminal 34, a first negative terminal 35, a first signal terminal 36, and a first serial terminal 37. Any of the first positive terminal 34, the first negative terminal 35, the first signal terminal 36, and the first serial terminal 37 may be excluded from the first terminal portion 62.

The charger 3 further includes a first MPU 32, a first communicator 33, a shunt resistor 38, and a power-supply circuit 40. Any of the first MPU 32, the first communicator 33, the shunt resistor 38, and the power-supply circuit 40 may be excluded from the charger 3.

The power-supply circuit 40 is a switching power supply, and includes a transformer 41, a diode 42, and a temperature detector 43. The power-supply circuit 40 also includes a not-shown switching element, such as an FET, and so on. The power-supply circuit 40 is connected to the first positive terminal 34 and to the first negative terminal 35 via the positive electrode line 341 and the negative electrode line 351, respectively. The power-supply circuit 40 supplies the generated second electric power to the battery pack 2 through the first positive terminal 34 and the first negative terminal 35. Any of the transformer 41, the diode 42, and the temperature detector 43 may be excluded from the power-supply circuit 40.

Specifically, the transformer 41 steps down an AC voltage of the external power supply 70. The diode 42 is connected to the secondary side of the transformer 41, and rectifies the AC voltage stepped down by the transformer 41. The transformer 41, the diode 42, and the not-shown switching element correspond to one example of a heat-generating component of the present disclosure that generates heat in response to output of a charging current by the charger 3.

The temperature detector 43 detects a temperature Tc of the heat-generating component included in the power-supply circuit 40. Specifically, the temperature detector 43 is provided in the vicinity of the diode 42, and detects a temperature of the diode 42 as the temperature Tc. Then, the temperature detector 43 outputs the detected temperature Tc to the first MPU 32.

The temperature detector 43 is, for example, a thermistor. The diode 42, the transformer 41, and the temperature detector 43 are provided on a single circuit board. The circuit board has a first surface and a second surface. The diode 42 and the transformer 41 are arranged on the first surface of the circuit board. Terminals of the diode 42 and the transformer 41 each penetrate the circuit board to protrude from the second surface, and are soldered onto the second surface. The temperature detector 43 is arranged in the vicinity of a part where the terminal of the diode 42 is soldered, on the second surface of the circuit board.

Here, it is difficult to arrange the temperature detector 43 in the vicinity of the transformer 41. The transformer 41 is internally insulated. In a case of arranging the temperature detector 43 on the primary side of the transformer 41, insulation designing is difficult, thus reducing the degree of freedom in designing the power-supply circuit 40. Moreover, since the transformer 41 is a device to perform electric power conversion, power system wiring pattern covers a large area of the circuit board, at the periphery of the secondary side of the transformer 41. Therefore, if the temperature detector 43 is arranged on the secondary side of the transformer 41, switching noise is more prone to be superimposed on an analog signal outputted from the temperature detector 43. This makes the first MPU 32 more prone to erroneously detect the temperature Tc. Meanwhile, the diode 42 is arranged closer to the first MPU 32 than the transformer 41 is. Therefore, in the case where the temperature detector 43 is arranged in the vicinity of the diode 42, the wiring from the temperature detector 43 to the first MPU 32 is shorter than in a case where the temperature detector 43 is arranged in the vicinity of the secondary side of the transformer 41. Consequently, in the case where the temperature detector 43 is arranged in the vicinity of the diode 42, switching noise is less prone to be superimposed on an analog signal outputted from the temperature detector 43. That is, arranging the temperature detector 43 in the vicinity of the diode 42 enables the degree of freedom in designing the power-supply circuit 40 to be comparatively high, and enables inhibition of the erroneous detection of the temperature Tc. Where the temperature detector 43 is arranged is not limited to the vicinity of the part where the terminal of the diode 42 is soldered. For example, a heat sink may be provided in the vicinity of the diode 42 on the circuit board, and the temperature detector 43 may be arranged in the heat sink.

The shunt resistor 38 is provided on the negative electrode line 351. The shunt resistor 38 detects a value of a charging current (i.e., a charging current value) Io flowing from the charger 3 to the battery pack 2, and outputs the detected charging current value Io to the first MPU 32.

The first communicator 33 is connected to the first serial terminal 37. The first communicator 33 is a communication circuit to perform a serial communication.

The first MPU 32 includes a CPU 32a and a memory 32b, and is connected to the first signal terminal 36. The first MPU 32 receives a signal from the battery pack 2 and transmits a signal to the battery pack 2 through the first signal terminal 36. The first MPU 32 also performs a serial communication with the battery pack 2 through the first communicator 33 and the first serial terminal 37.

The first MPU 32 executes an integrated capacity calculation process and a charge control process based on various information inputted to the first MPU 32. Specifically, the first MPU 32 executes the integrated capacity calculation process based on the inputted charging current value Jo, during a period in which the power cord 31 is electrically connected to the external power supply 70. Further, in response to detecting attachment of the battery pack 2 through the first signal terminal 36, the first MPU 32 executes the charge control process based on the inputted temperature Tc and a demanded current value Id. Details of the integrated capacity calculation process and the charge control process will be described below.

The second terminal portion 52 includes a second positive terminal 24, a second negative terminal 25, a second signal terminal 26, and a second serial terminal 27. Any of the second positive terminal 24, the second negative terminal 25, the second signal terminal 26, and the second serial terminal 27 may be excluded from the second terminal portion 52. The second positive terminal 24 is connected to the first positive terminal 34. The second negative terminal 25 is connected to the first negative terminal 35. The second signal terminal 26 is connected to the first signal terminal 36. The second serial terminal 27 is connected to the first serial terminal 37.

The battery pack 2 further includes a battery 21, a second MPU 22, and a second communicator 23. Any of the battery 21, the second MPU 22, and the second communicator 23 may be excluded from the battery pack 2.

The battery 21 includes battery cells connected in series. A positive electrode of the battery 21 is connected to the second positive terminal 24, and a negative electrode of the battery 21 is connected to the second negative terminal 25.

The second communicator 23 is connected to the second serial terminal 27. The second communicator 23 is a communication circuit to perform a serial communication.

The second MPU 22 includes a CPU 22a and a memory 22b, and is connected to the second signal terminal 26. The second MPU 22 receives a signal from the charger 3 and transmits a signal to the charger 3 through the second signal terminal 26. The second MPU 22 also performs a serial communication with the charger 3 through the second communicator 23 and the second serial terminal 27.

Specifically, the second MPU 22 calculates, during charging, the demanded current value Id based on a voltage value of the battery 21. The demanded current value Id decreases according to increase in the voltage value of the battery 21. Then, the second MPU 22 transmits the calculated demanded current value Id to the charger 3 through the second communicator 23 and the second serial terminal 27.

<2. Processes>
<2-1. Integrated Capacity Calculation Process>

During charging by the charger 3, the temperature of the heat-generating component, such as the transformer 41 and the diode 42, rises. If the temperature of the heat-generating component in the charger 3 excessively rises to exceed a permissible temperature, the charger 3 may fail. The permissible temperature is an upper limit of a temperature at which operation of the heat-generating component is guaranteed. Thus, it is necessary to suppress the charging current before the temperature of the heat-generating component excessively rises. Therefore, the first MPU 32 suppresses the charging current in response to the temperature Tc having reached a temperature threshold or higher. However, if the temperature threshold is set to be constant with no consideration for a temperature state at the start of charging, it may be impossible to properly protect the heat-generating component.

Figure 6:
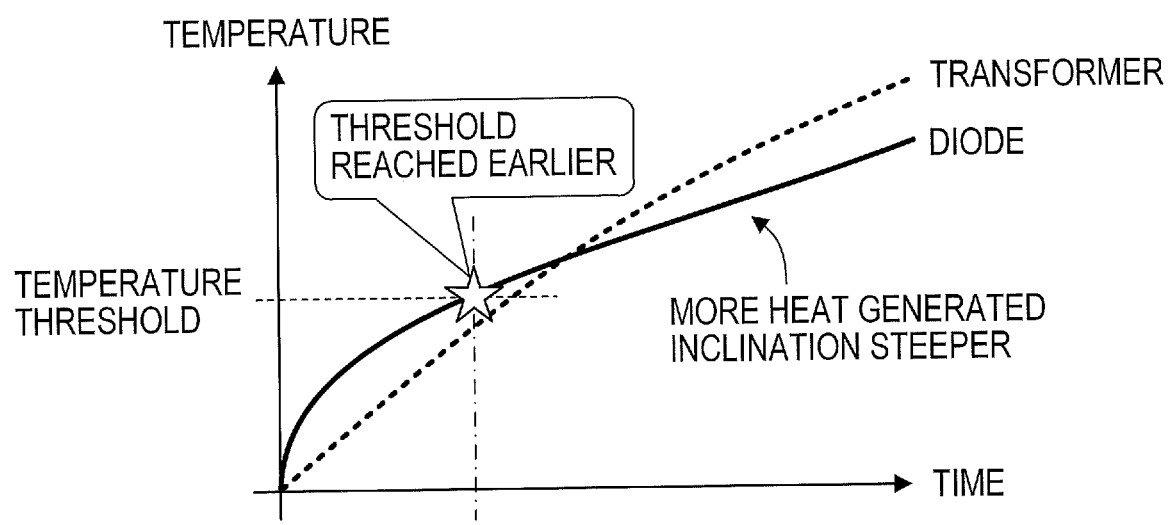
FIG. 6 is a diagram showing time variation of temperatures of a diode and a transformer and a temperature threshold during charging of a lower-capacity battery.
Figure 7:
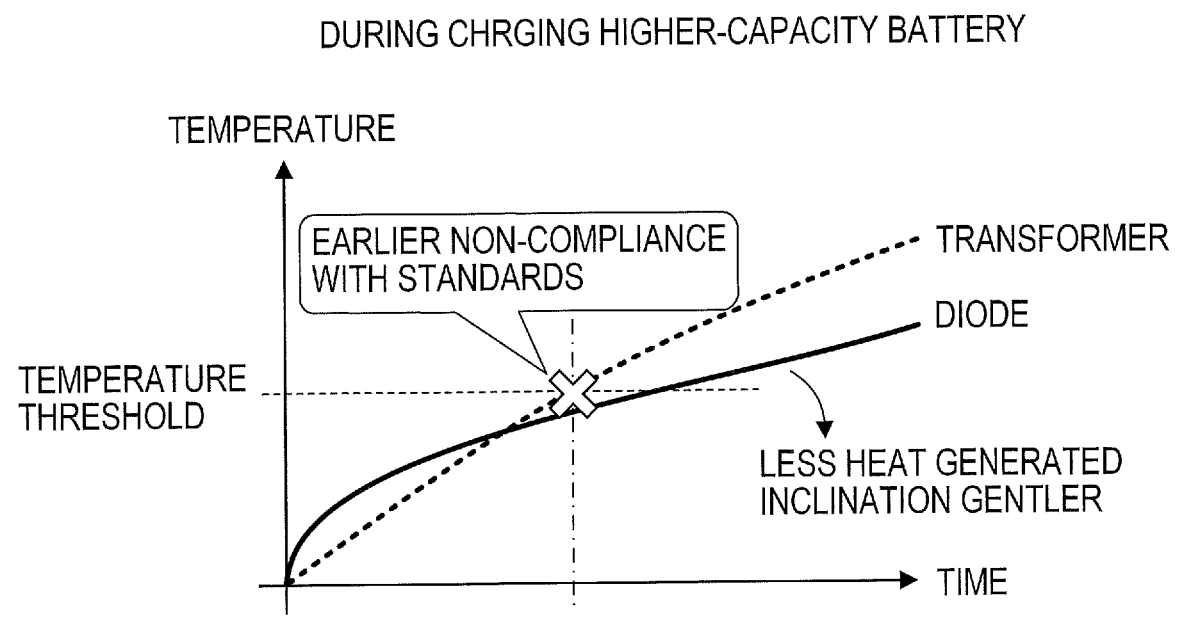
FIG. 7 is a diagram showing time variation of temperatures of the diode and the transformer and a temperature threshold during charging of a higher-capacity battery.

Tendencies of temperature rise of the transformer 41 and the diode 42 vary according to the capacity of the battery pack 2. FIGS. 6 and 7 show changes in temperature of the transformer 41 and the diode 42 in the charger 3, in cases where the battery packs 2 having, respectively, a comparatively low capacity and a comparatively high capacity are charged with a charging current of the same value.

As shown in FIGS. 6 and 7, in the case where the battery pack 2 having a higher capacity is charged with a charging current of the same value as that for the battery pack 2 having a lower capacity, the charging time is lengthened as compared with the case of the battery pack 2 having a lower capacity, resulting in gentler rise in battery voltage. Therefore, electric energy supplied from the charger 3 to the battery pack 2 having a higher capacity increases more gently than that supplied to the battery pack 2 having a lower capacity. As a result, the temperatures of the transformer 41 and the switching element included in the power-supply circuit 40 rise gently.

It is ideal that the speed of temperature rise of the diode 42 does not change in the case of charging the battery pack 2 having a different capacity with the charging current of the same value. However, the diode 42 is arranged in the vicinity of the heat-generating component, such as the transformer 41, whose speed of temperature rise depends on the magnitude of the capacity of the battery pack 2. Thus, in actuality, in the case of charging the battery pack 2 having a higher capacity with the charging current of the same value as that for the battery pack 2 having a lower capacity, the speed of temperature rise of the diode 42 becomes gentler due to influence of the heat of the heat-generating component around it. Accordingly, in the case of charging the battery pack 2 having a higher capacity, the temperature rises of the transformer 41 and the diode 42 are gentler than in the case of charging the battery pack 2 having a lower capacity. However, the temperature rise of the diode 42 is gentler than that of the transformer 41.

Consequently, as shown in FIG. 6, in the case of charging a low-capacity battery, the temperature of the diode 42 is always higher than that of the transformer 41 until it reaches the temperature threshold. On the other hand, as shown in FIG. 7, in the case of charging a high-capacity battery, the temperature of the diode 42 is higher than that of the transformer 41 in an early stage of the charging, but becomes lower than that of the transformer 41 before reaching the temperature threshold, and the temperature of the transformer 41 reaches the temperature threshold earlier. However, as described above, it is difficult to directly detect the temperature of the transformer 41.

Thus, the first MPU 32 estimates the temperature of the transformer 41, and sets the temperature threshold so that the temperature of the diode 42 reaches the temperature threshold before the estimated temperature exceeds the permissible temperature. That is, in the case where the temperature of the diode 42 is comparatively high, the first MPU 32 sets the temperature threshold to be smaller than in the case where the temperature of the diode 42 is comparatively low. Specifically, the first MPU 32 calculates an integrated capacity A1 (Ah) as an index indicating a temperature state of the transformer 41. The integrated capacity A1 is an integrated value of the capacity that the charger 3 has charged. For example, if the integrated capacity A1 is 2 Ah, it is estimated that the temperature of the transformer 41 has risen to a temperature comparable to that in the case where the battery pack 2 of 2 Ah has been charged.

Figure 3:
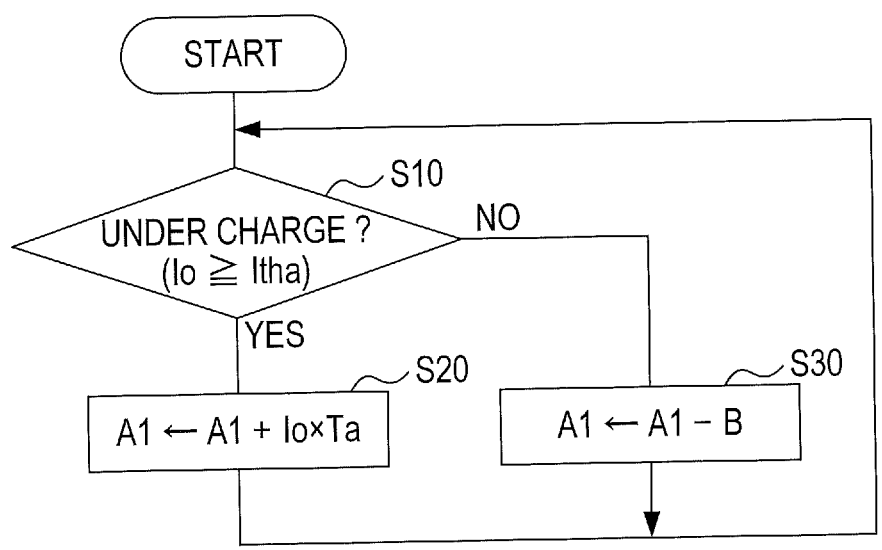
FIG. 3 is a flowchart showing a process for calculating an integrated charging capacity according to the embodiment.

The first MPU 32 starts execution of the integrated capacity calculation process upon connection of the power cord 31 to the external power supply 70, and ends the execution of the integrated capacity calculation process upon disconnection of the power cord 31 from the external power supply 70. During a period in which the charger 3 is supplied with the electric power from the external power supply 70, the first MPU 32 performs processes in S10 to S30 to be described below in a specified process cycle Ta. The integrated capacity calculation process executed by the first MPU 32 will be described below with reference to a flowchart of FIG. 3.

In S10, the first MPU 32 determines whether charging is being performed. Specifically, the first MPU 32 determines whether the charging current value Io is larger than or equal to a current threshold Itha. The current threshold Itha is set to a value close to 0 A, for example, 0.3 A. In S10, in the case of determining that charging is being performed (S10: YES), the first MPU 32 proceeds to the process in S20, whereas in the case of determining that charging is not being performed (S10: NO), the first MPU 32 proceeds to the process in S30.

In S20, the first MPU 32 updates the integrated capacity A1 to a value obtained by adding an amount of current in one process cycle to the present integrated capacity A1. The amount of current is a value obtained by multiplying the present charging current value Io (A) by the process cycle Ta (h). However, if the integrated capacity A1 has reached an upper limit, the first MPU 32 stops updating the integrated capacity A1. The upper limit is, for example, 10 Ah.

In the present embodiment, an initial value of the integrated capacity A1 is set to 0 Ah. The initial value is a value of the integrated capacity A1 at a point of time when the power cord 31 is connected to the external power supply 70. The initial value is not limited to 0 Ah. For example, the initial value may be estimated from the integrated capacity A1 at a point of time when the power cord 31 is disconnected from the external power supply 70 last time. Alternatively, the initial value may be estimated from the temperature Tc detected by the temperature detector 43 at a point of time when the power cord 31 is connected to the external power supply 70. Upon completion of the process in S20, the first MPU 32 returns to the process in S10.

On the other hand, in S30, the first MPU 32 updates the integrated capacity A1 to a value obtained by subtracting a set value B from the present integrated capacity A1. Even while the power cord 31 is connected to the external power supply 70, the temperatures of the components included in the power-supply circuit 40 naturally drop if charging is not performed. The set value B is set based on the speed of the natural temperature drop of the power-supply circuit 40. For example, if the speed of the natural temperature drop of the power-supply circuit 40 corresponds to a speed at which the integrated capacity A1 is reduced by 3.6 Ah per hour, the set value B is set to 3.6 As per second.

While the charger 3 is electrically connected to the external power supply 70, the first MPU 32 performs the processes in S10 to S30 repeatedly. In this way, in a case where the charger 3 charges the two or more battery packs 2 sequentially, the electric energies supplied to the two or more battery packs 2 are all integrated to calculate the integrated capacity A1. Thus, the integrated capacity A1 that properly indicates a temperature state of the charger 3 can be calculated.

For example, in a case of sequentially charging a first battery pack 2A, a second battery pack 2B, and a third battery pack 2C, each having a capacity of 2 Ah, the temperature of the heat-generating component has risen, at a time point of starting charging of the third battery pack 2C, to a temperature comparable to that in a case where the battery pack 2 having the capacity of 4 Ah is charged. If the integrated capacity A1 is reset for each charging, the integrated capacity A1 at the start of charging the third battery pack 2C has a value obtained by integrating amounts of current that have been supplied to the second battery pack 2B alone. Therefore, if the integrated capacity A1 is reset for each charging, the integrated capacity A1 that does not properly indicate the temperature state of the charger 3 is calculated.

In contrast, by integrating the amounts of currents outputted from the charger 3 during a period in which the charger 3 is electrically connected to the external power supply 70, the integrated capacity A1 obtained by integrating the amounts of currents supplied to the first battery pack 2A and the second battery pack 2B is calculated at the start of charging the third battery pack 2C. Therefore, the integrated capacity A1 that properly indicates the temperature state of the charger 3 can be used. The first battery pack 2A, the second battery pack 2B, and the third battery pack 2C each have a configuration similar to that of the battery pack 2.

<2-2. Charge Control Process>

Figure 4A:
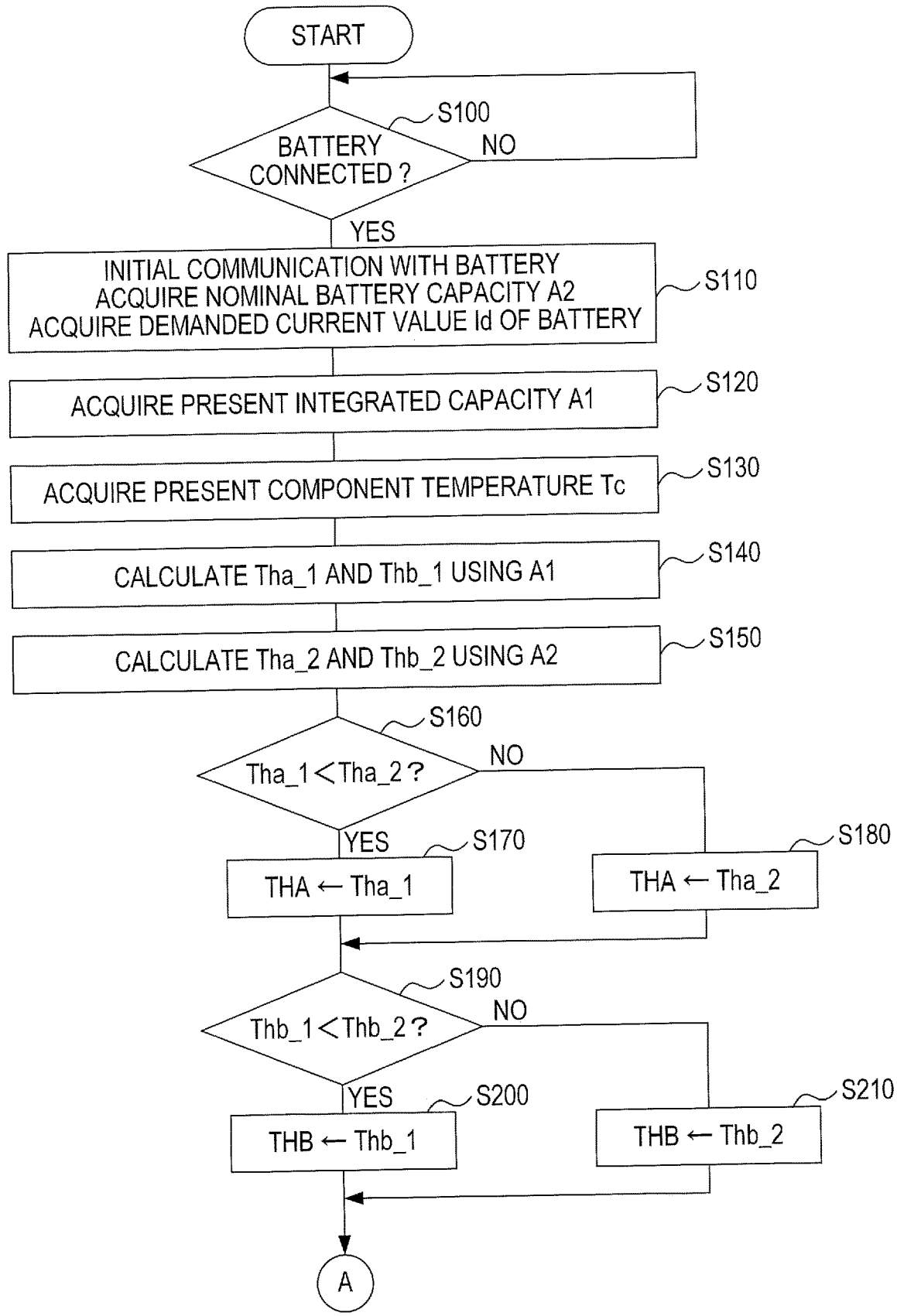
FIG. 4A is a flowchart showing a part of a charge control process according to the embodiment.
Figure 4B:
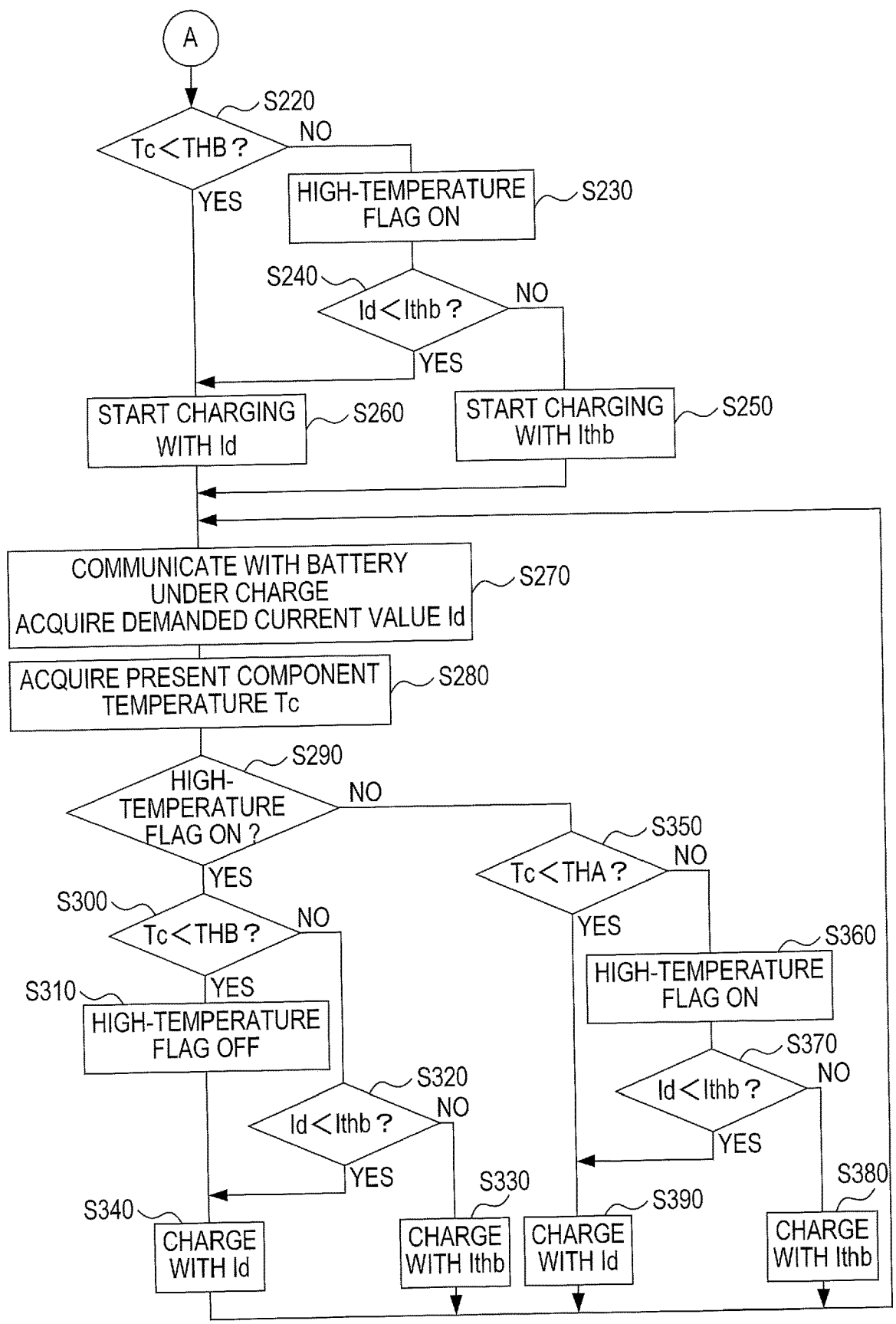
FIG. 4B is a flowchart showing a remaining part of the charge control process according to the embodiment.

Next, the charge control process executed by the first MPU 32 will be described with reference to flowcharts of FIGS. 4A and 4B. The first MPU 32 starts the charge control process upon connection of the power cord 31 to the external power supply 70, and ends the charge control process upon disconnection of the power cord 31 from the external power supply 70. The first MPU 32 executes the charge control process in parallel with the integrated capacity calculation process.

In S100, the first MPU 32 determines whether the battery pack 2 is connected to the charger 3. Upon connection of the second signal terminal 26 to the first signal terminal 36, an electric potential of the first signal terminal 36 changes, thus changing an electric potential of an input signal to be inputted to the first MPU 32. The first MPU 32 detects connection of the battery pack 2 in response to the change of the electric potential of the input signal inputted from the first signal terminal 36. In S100, in the case of detecting the connection of the battery pack 2 (S100: YES), the first MPU 32 proceeds to a process in S110, whereas in the case of not detecting the connection of the battery pack 2 (S100: NO), the first MPU 32 performs the process in S100 repeatedly until it detects the connection.

In S110, the first MPU 32 performs an initial communication with the battery pack 2 through the first communicator 33 and the first serial terminal 37 to acquire a nominal battery capacity A2 (Ah) and the demanded current value Id of the battery pack 2.

As described above, the tendencies of temperature rise of the transformer 41 and the diode 42 vary according to the capacity of the battery pack 2. As shown in FIG. 7, if the temperature threshold in charging the battery pack 2 having a higher capacity is set to the same value as the temperature threshold in charging the battery pack 2 having a lower capacity, a situation may occur in which the charger 3 cannot be properly protected in charging the battery pack 2 having a higher capacity.

Figure 8:
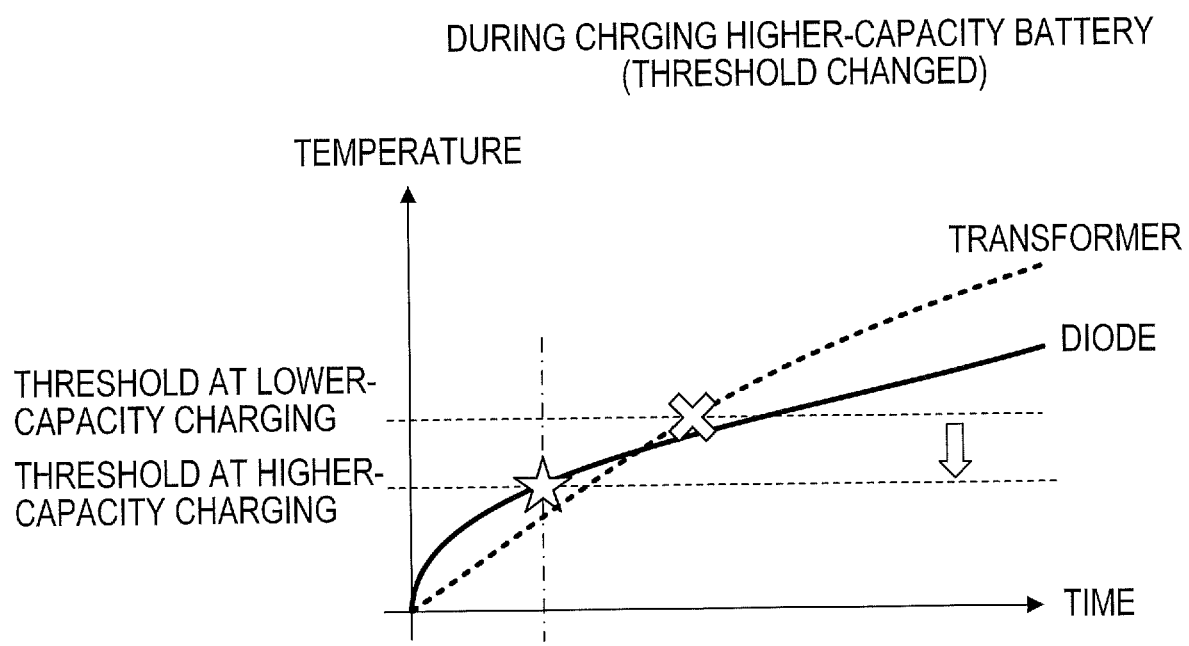
FIG. 8 is a diagram showing: time variation of temperatures of the diode and the transformer; and a temperature threshold at the time of lower capacity charging and a temperature threshold at the time of higher capacity charging, during charging of the higher-capacity battery.

Therefore, as shown in FIG. 8, in charging the battery pack 2 having a higher capacity, the temperature threshold is set to be smaller than that in charging the battery pack 2 having a lower capacity. Thus, in the present embodiment, the first MPU 23 sets the temperature threshold (specifically, a detection threshold THA and a cancel threshold THB to be described below) using the nominal battery capacity A2.

In S120, the first MPU 32 acquires the present integrated capacity A1. That is, the first MPU 32 acquires the integrated capacity A1 that indicates the temperature state of the charger 3 at the start of charging. Then, in S130, the first MPU 32 acquires the present temperature Tc.

Figure 5:
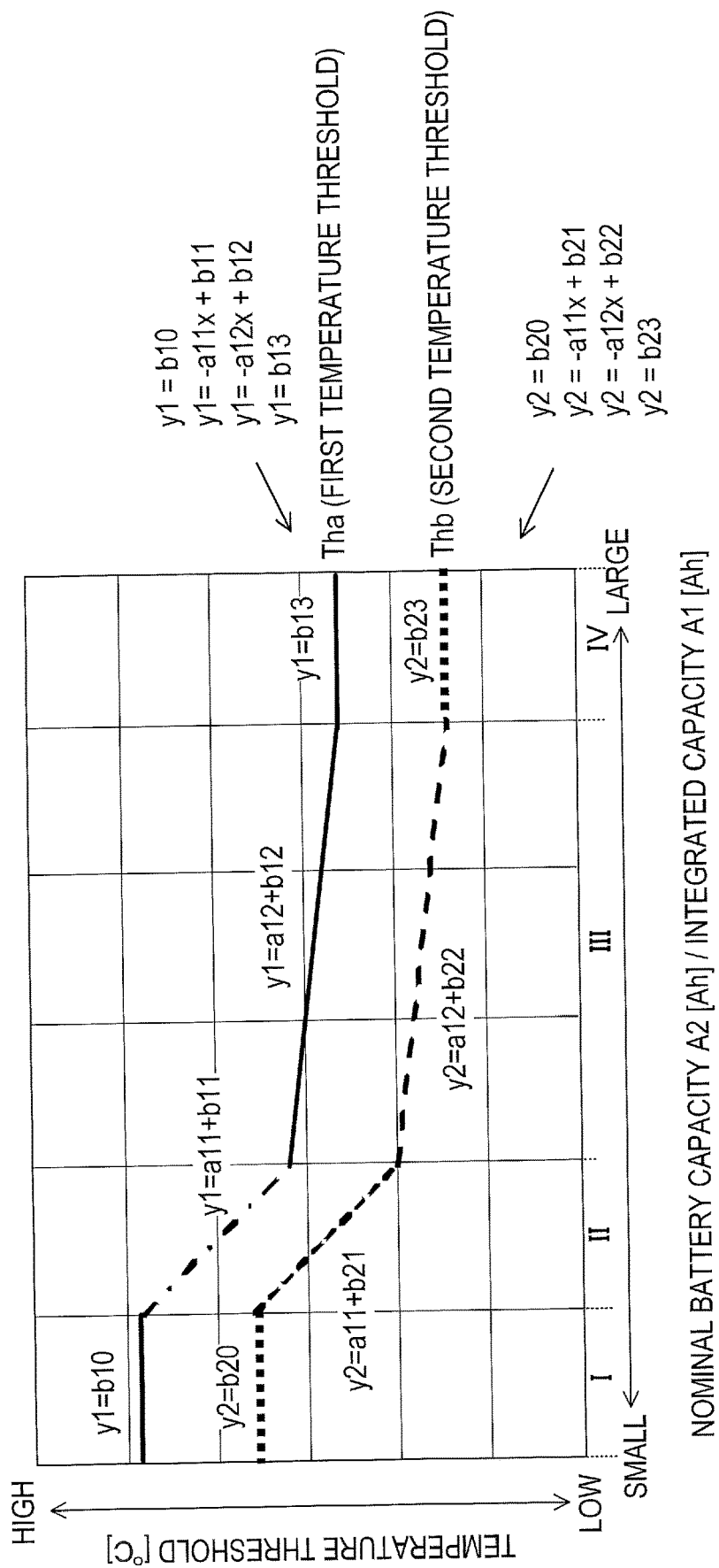
FIG. 5 is a diagram showing relationships of a first temperature threshold and a second temperature threshold with respect to a nominal battery capacity and the integrated charging capacity according to the embodiment.

Subsequently, in S140, the first MPU 32 calculates a first detection threshold candidate Tha_1 and a first cancel threshold candidate Thb_1 using the integrated capacity A1 acquired in S120 and correspondence information. As shown in FIG. 5, the correspondence information corresponds to a correspondence relationship between: the integrated capacity A1 and the nominal battery capacity A2; and the temperature threshold, and is stored in the memory 32b. The temperature threshold in this correspondence relationship corresponds to a temperature at which reduction of the charging current value Io needs to be started, and has been obtained by simulation and/or experiment.

The temperature threshold includes a first temperature threshold Tha and a second temperature threshold Thb. The first temperature threshold Tha is a threshold for starting protection of the charger 3 upon the temperature Tc exceeding such value. The second temperature threshold Thb is a threshold for canceling the protection of the charger 3 upon the temperature Tc having become smaller than such value. The correspondence relationship may be relational expressions or may be a table. In the present embodiment, the correspondence relationship is represented by a first relational expression and a second relational expression. The first relational expression represents a relationship between: the integrated capacity A1 and the nominal battery capacity A2; and the first temperature threshold Tha. The second relational expression represents a relationship between: the integrated capacity A1 and the nominal battery capacity A2; and the second temperature threshold Thb.

Specifically, as shown in FIG. 5, the integrated capacity A1 and the nominal battery capacity A2 are divided into four regions, that is, a first region I, a second region II, a third region III, and a fourth region IV, and the first relational expression and the second relational expression are set for each region. In FIG. 5, "x" in the first and second relational expressions is a variable to which the integrated capacity A1 or the nominal battery capacity A2 is assigned. Further, "y1" in the first relational expression is a variable corresponding to the first temperature threshold Tha, and "y2" in the second relational expression is a variable corresponding to the second temperature threshold Thb. An inclination of the first relational expression is equal to an inclination of the second relational expression. That is, the first temperature threshold Tha corresponds to a value obtained by offsetting the second temperature threshold Thb so as to be higher by a specified temperature.

The first MPU 32 calculates the first temperature threshold Tha corresponding to the integrated capacity A1 acquired in S120, as the first detection threshold candidate Tha_1, using the first relational expression. Also, the first MPU 32 calculates the second temperature threshold Thb corresponding to the integrated capacity A1, as the first cancel threshold candidate Thb_1, using the second relational expression.

Then, in S150, the first MPU 32 calculates the second detection threshold candidate Tha_2 and the second cancel threshold candidate Thb_2 in a similar manner as in S140, using the nominal battery capacity A2 acquired in S110 and the first and second relational expressions.

Next, in S160, the first MPU 32 determines whether the first detection threshold candidate Tha_1 calculated in S140 is smaller than the second detection threshold candidate Tha_2 calculated in S150. In the case of determining in S160 that the first detection threshold candidate Tha_1 is smaller than the second detection threshold candidate Tha_2 (S160: YES), the first MPU 32 sets, in S170, the first detection threshold candidate Tha_1 as the detection threshold THA. On the other hand, in the case of determining in S160 that the first detection threshold candidate Tha_1 is larger than or equal to the second detection threshold candidate Tha_2 (S160: NO), the first MPU 32 sets, in S180, the second detection threshold candidate Tha_2 as the detection threshold THA. That is, the first MPU 32 sets the first detection threshold candidate Tha_1 or the second detection threshold candidate Tha_2, whichever is smaller, as the detection threshold THA.

Subsequently, in S190, the first MPU 32 determines whether the first cancel threshold candidate Thb_1 calculated in S140 is smaller than the second cancel threshold candidate Thb_2 calculated in S150. In the case of determining in S190 that the first cancel threshold candidate Thb_1 is smaller than the second cancel threshold candidate Thb_2 (S190: YES), the first MPU 32 sets, in S200, the first cancel threshold candidate Thb_1 as the cancel threshold THB. On the other hand, in the case of determining in S190 that the first cancel threshold candidate Thb_1 is larger than or equal to the second cancel threshold candidate Thb_2 (S190: NO), the first MPU 32 sets, in S210, the second cancel threshold candidate Thb_2 as the cancel threshold THB. That is, the first MPU 32 sets the first cancel threshold candidate Thb_1 or the second cancel threshold candidate Thb_2, whichever is smaller, as the cancel threshold THB.

In the case where the charger 3 charges the first battery pack 2A, the integrated capacity A1 is 0 Ah; thus, if the detection threshold THA and the cancel threshold THB are set based only on the integrated capacity A1, the detection threshold THA and the cancel threshold THB each having a comparatively large value are set. As a result, when charging the first battery pack 2A having a comparatively high capacity at first, a situation may occur in which the temperature of the transformer 41 exceeds the permissible temperature before the temperature Tc reaches the detection threshold THA, thus failing to protect the charger 3 properly.

On the other hand, if the detection threshold THA and the cancel threshold THB are set based only on the nominal battery capacity A2, the detection threshold THA and the cancel threshold THB each having a comparatively large value are set when charging the first battery pack 2A having a comparatively low capacity. Thus, in a case of charging the second battery pack 2B having a comparatively low capacity when the temperature of the transformer 41 is comparatively high due to charging of the first battery pack 2A having a comparatively high capacity by the charger 3, the detection threshold THA and the cancel threshold THB each having a comparatively large value are set. As a result, during charging of the second battery pack 2B having a comparatively low capacity, a situation may occur in which the temperature of the transformer 41 exceeds the permissible temperature before the temperature Tc reaches the detection threshold THA, thus failing to protect the charger 3 properly.

In the present embodiment, the first MPU 32 sets the first detection threshold candidate Tha_1 or the second detection threshold candidate Tha_2, whichever is smaller, as the detection threshold THA, and sets the first cancel threshold candidate Thb_1 or the second cancel threshold candidate Thb_2, whichever is smaller, as the cancel threshold THB. This results in setting the detection threshold THA and the cancel threshold THB that enable proper protection of the charger 3 even when charging the two or more battery packs 2 having different capacities in whatever order.

Subsequently, in S220, the first MPU 32 determines whether the temperature Tc acquired in S130 is smaller than the set cancel threshold THB. In the case of determining in S220 that the temperature Tc is larger than or equal to the cancel threshold THB (S220: NO), the first MPU 32 proceeds to a process in S230.

In S230, the first MPU 32 sets a high-temperature flag ON. The high-temperature flag is a flag for starting protection of the charger 3. At the start of charging the battery pack 2, the first MPU 32 determines whether to start protection of the charger 3 using the cancel threshold THB that is smaller than the detection threshold THA. There is a case in which another battery pack 2 has been charged before starting charging of the battery pack 2 this time. Moreover, there is a case in which the temperature Tc becomes larger than or equal to the detection threshold THA during charging of such another battery pack 2 to thereby start protection of the charger 3. Furthermore, there is a case in which the charging of such another battery pack 2 ends before the temperature Tc becomes smaller than the cancel threshold THB, that is, during the protection of the charger 3. In a case of subsequently starting charging of the battery pack 2 of this time under such circumstances, it is desirable to continue the protection of the charger 3 until the temperature Tc drops to the cancel threshold THB. Therefore, at the start of charging the battery pack 2, the first MPU 32 determines whether to start protection of the charger 3 using the cancel threshold THB.

Subsequently, in S240, the first MPU 32 determines whether the demanded current value Id acquired in S110 is smaller than a reduced current value Ithb. The reduced current value Ithb is a value small enough to enable suppression of the temperature rise of the heat-generating component, that is, 2 A, for example.

In the case of determining in S240 that the demanded current value Id is larger than or equal to the reduced current value Ithb (S240: NO), the first MPU 32 proceeds to a process in S250. In S250, the first MPU 32 starts charging with a charging current of the reduced current value Ithb smaller than the demanded current value Id. This allows suppression of the temperature rise of the heat-generating component in the charger 3, thus protecting the charger 3. Upon completion of the process in S250, the first MPU 32 proceeds to a process in S270.

On the other hand, in the case of determining in S240 that the demanded current value Id is smaller than the reduced current value Ithb (S240: YES), the first MPU 32 proceeds to a process in S260. In S260, the first MPU 32 starts charging with a charging current of the demanded current value Id. In this case, the charger 3 is in a state where it should be protected, whereas the demanded current value Id is small enough. Therefore, the temperature rise of the heat-generating component in the charger 3 can be suppressed even when the charging is performed with the charging current of the demanded current value Id; thus, it is not necessary to reduce the charging current.

The situation in which the demanded current value Id is smaller than the reduced current value Ithb occurs when the battery pack 2 has become close to full charge and the battery voltage has become close to a rated voltage. The situation in which the battery pack 2 is close to full charge at the start of charging occurs when a user charges the battery pack continuously and additionally (i.e., when a user recharges the battery pack before it is fully discharged). Upon completion of the process in S260, the first MPU 32 proceeds to the process in S270.

In the case of determining in S220 that the temperature Tc is smaller than the cancel threshold THB (S220: YES), the first MPU 32 proceeds to the process in S260. In this case, since the temperature Tc has dropped sufficiently at the start of charging, it is not necessary to protect the charger 3. Thus, in S260, the first MPU 32 performs charging with the charging current of the demanded current value Id. Upon completion of the process in S260, the first MPU 32 proceeds to the process in S270.

Then, in S270, the first MPU 32 performs communication with the battery pack 2 under charge, and acquires the demanded current value Id. The demanded current value Id is reduced as the charging of the battery pack 2 progresses. Upon the demanded current value Id being zero, the first MPU 32 ends the charging of the battery pack 2, and returns to the process in S100.

Next, in S280, the first MPU 32 acquires the present temperature Tc. Subsequently, in S290, the first MPU 32 determines whether the high-temperature flag is ON. In the case of determining in S290 that the high-temperature flag is ON (S290: YES), the first MPU 32 proceeds to a process in S300.

In S300, the first MPU 32 determines whether the temperature Tc acquired in S280 is smaller than the cancel threshold THB. That is, the first MPU 32 determines whether the protection of the charger 3 can be canceled. In the case of determining in S300 that the temperature Tc is smaller than the cancel threshold THB (S300: YES), the first MPU 32 proceeds to a process in S310. In S310, the first MPU 32 sets the high-temperature flag OFF, and proceeds to a process in S340.

On the other hand, in the case of determining in S300 that the temperature Tc is larger than or equal to the cancel threshold THB (S300: NO), the first MPU 32 proceeds to a process in S320. In S320, the first MPU 32 determines whether the demanded current value Id acquired in S270 is smaller than the reduced current value Ithb.

In the case of determining in S320 that the demanded current value Id is larger than or equal to the reduced current value Ithb (S320: NO), the first MPU 32 proceeds to a process in S330. In S330, the first MPU 32 continues charging with the charging current of the reduced current value Ithb smaller than the demanded current value Id. Upon completion of the process in S330, the first MPU 32 returns to the process in S270.

On the other hand, in the case of determining in S320 that the demanded current value Id is smaller than the reduced current value Ithb (S320: YES), the first MPU 32 proceeds to a process in S340. In S340, the first MPU 32 continues charging with the charging current of the demanded current value Id. Upon completion of the process in S340, the first MPU 32 returns to the process in S270.

In the case of determining in S290 that the high-temperature flag is OFF (S290: NO), the first MPU 32 proceeds to a process in S350. In S350, the first MPU 32 determines whether the temperature Tc acquired in S280 is smaller than the detection threshold THA. That is, the first MPU 32 determines whether protection of the charger 3 need not be started.

In the case of determining in S350 that the temperature Tc is larger than or equal to the detection threshold THA (S350: NO), the first MPU 32 proceeds to a process in S360. In S360, the first MPU 32 sets the high-temperature flag ON as protection of the charger 3 needs to be started.

Subsequently, in S370, the first MPU 32 determines whether the demanded current value Id acquired in S270 is smaller than the reduced current value Ithb.

In the case of determining in S370 that the demanded current value Id is larger than or equal to the reduced current value Ithb (S370: NO), the first MPU 32 proceeds to a process in S380. In S380, the first MPU 32 continues charging with the charging current of the reduced current value Ithb smaller than the demanded current value Id. This allows suppression of the temperature rise of the heat-generating component in the charger 3, thus protecting the charger 3.

On the other hand, in the case of determining in S370 that the demanded current value Id is smaller than the reduced current value Ithb (S370: YES), the first MPU 32 proceeds to a process in S390. In S390, the first MPU 32 continues charging with the charging current of the demanded current value Id. In this case, the charger 3 is in the state where it should be protected, whereas the demanded current value Id is small enough; thus, it is not necessary to reduce the charging current. Upon completion of the process in S390, the first MPU 32 returns to the process in S270.

In the case of determining in S350 that the temperature Tc is smaller than the detection threshold THA (S350: YES), the first MPU 32 proceeds to a process in S390. In S390, it is not necessary to start protection of the charger 3; thus, the first MPU 32 continues charging with the charging current of the demanded current value Id acquired in S270. Upon completion of the process in S390, the first MPU 32 returns to the process in S270.

<3. Effects>

The embodiment described so far provides the following effects.

(1) During the period in which the charger 3 is electrically connected to the external power supply 70, the amounts of current supplied to the battery pack 2 are integrated. This results in calculating the integrated capacity A1 that properly indicates the temperature state of the transformer 41 included in the charger 3. Then, the detection threshold THA is set based on the integrated capacity A1 and the first relational expression. That is, the detection threshold THA is set according to the temperature state of the transformer 41. Moreover, in the case where the detected temperature Tc becomes larger than or equal to the set detection threshold THA, the demanded current value Id is reduced to the reduced current value Ithb. Accordingly, the charger 3 can be protected properly.

(2) In the case where the charging current value Io is smaller than the current threshold Itha, the heat-generating component in the charger 3 radiates heat, thus lowering the temperature of the heat-generating component. Thus, in the case where the charging current value Io is smaller than the current threshold Itha during the period in which the charger 3 is electrically connected to the external power supply 70, a specified value is subtracted from the integrated value. This makes it possible to calculate the integrated capacity A1 that indicates the temperature state of the transformer 41 more properly.

(3) The first detection threshold candidate Thai calculated based on the integrated capacity A1 or the second detection threshold candidate Tha_2 calculated based on the nominal battery capacity A2, whichever is smaller, is set as the detection threshold THA. This allows for setting of the detection threshold THA that enables proper protection of the charger 3 even when charging the two or more battery packs 2 having different capacities in whatever order.

(4) The first cancel threshold candidate Thb_1 or the second cancel threshold candidate Thb_2, whichever is smaller, is set as the cancel threshold THB. This results in performing reduction of the charging current value Io upon the temperature Tc having become larger than or equal to the detection threshold THA, and in canceling the reduction of the charging current value Io upon the temperature Tc having become smaller than the cancel threshold THB. Accordingly, reduction of the charging current value Io can be performed and canceled properly.

(5) At the start of charging the battery pack 2, if the temperature Tc is larger than or equal to the cancel threshold THB, the charging current value Io is reduced. This enables proper protection of the charger 3 even in the case of charging the two or more battery packs 2 sequentially.

OTHER EMBODIMENTS

Although the embodiment for carrying out the present disclosure has been described so far, the present disclosure is not limited to the above-described embodiment and can be carried out in variously modified ways.

(a) In the above-described embodiment, the detection threshold THA and the cancel threshold THB are set using both the integrated capacity A1 and the nominal battery capacity A2. However, the detection threshold THA and the cancel threshold THB may be set using only the integrated capacity A1. Although the charger 3 can be protected in a more preferred manner by using both the integrated capacity A1 and the nominal battery capacity A2, the charger 3 can be protected by using only the integrated capacity A1 as well.

(b) In the above-described embodiment, the charger 3 includes the first MPU 32. However, in place of the first MPU 32, or in addition to the first MPU 32, the charger 3 may include Application Specified Integrated Circuit (ASIC), or Application Specific Standard Product (ASSP), or a programmable logic device such as Field Programmable Gate Array (FPGA), or a combination thereof.

(c) In the above-described embodiment, the first detection threshold candidate Tha_1 and the first cancel threshold candidate Thb_1 are calculated using the integrated capacity A1 at the start of charging. However, the present disclosure is not limited to this. It may be possible to calculate the first detection threshold candidate Thai and the first cancel threshold candidate Thb_1 using the real-time integrated capacity A1 during charging, and then to calculate the detection threshold THA and the cancel threshold THB. For example, it may be possible to calculate the first detection threshold candidate Tha_1 and the first cancel threshold candidate Thb_1 using the real-time integrated capacity A1 at specified time intervals during charging, and then to calculate the detection threshold THA and the cancel threshold THB.

(d) Two or more functions of a single element in the above-described embodiment may be performed by two or more elements, and a single function of a single element may be performed by two or more elements. Two or more functions performed by two or more elements may be performed by a single element, and a single function performed by two or more elements may be performed by a single element. Part of a configuration in the above-described embodiment may be omitted. At least part of a configuration in the above-described embodiment may be added to or replace another configuration in the above-described embodiment.

(e) In addition to the above-described charger, the present disclosure may also be practiced in various forms, such as a system including this charger as an element, a program for causing a computer to function as this charger, a non-transitory tangible storage medium, such as a semiconductor memory, in which this program is stored, or a method for protecting the charger.

What is claimed is:

1. A charger comprising:
 a power cord configured to be connected to an external power supply, the external power supply outputting a first electric power;
 a first terminal portion configured to be connected to a battery having a nominal capacity;
 a power-supply circuit including a heat generating component, the power-supply circuit being configured to (i) generate a second electric power from the first electric power inputted through the power cord and (ii) output the second electric power through the first terminal portion;
 a storage device storing a first correspondence data and a second correspondence data, the first correspondence data indicating a correspondence relationship between a battery capacity and a first temperature threshold, the second correspondence data indicating a correspondence relationship between the battery capacity and a second temperature threshold, and the second temperature threshold being smaller than the first temperature threshold;

a temperature detection circuit configured to detect a temperature of the heat-generating component; and a processor programmed to perform:
- a first function to calculate an integrated capacity during a period in which the power cord is electrically connected to the external power supply, the integrated capacity corresponding to a value obtained by integrating an amount of current into a predetermined initial value, the amount of current being based on a value of a charging current outputted from the first terminal portion;
- a second function to acquire a capacity data, the capacity data indicating the nominal capacity;
- a third function to calculate, at a start of charging the battery, (i) a first detection threshold candidate and (ii) a first cancel threshold candidate based, respectively, on the first correspondence data and the second correspondence data stored in the storage device, the first detection threshold candidate corresponding to the first temperature threshold that is calculated, with the integrated capacity assigned to the battery capacity, based on the first correspondence data, and the first cancel threshold candidate corresponding to the second temperature threshold that is calculated, with the integrated capacity assigned to the battery capacity, based on the second correspondence data;
- a fourth function to calculate (i) a second detection threshold candidate and (ii) a second cancel threshold candidate based, respectively, on the first correspondence data and the second correspondence data stored in the storage device, the second detection threshold candidate corresponding to the first temperature threshold that is calculated, with the capacity data assigned to the battery capacity, based on the first correspondence data, and the second cancel threshold candidate corresponding to the second temperature threshold that is calculated, with the capacity data assigned to the battery capacity, based on the second correspondence data;
- a fifth function to set, at the start of charging the battery, a detection threshold to the first detection threshold candidate or the second detection threshold candidate, whichever is smaller;
- a sixth function to set, at the start of charging the battery, a cancel threshold to the first cancel threshold candidate or the second cancel threshold candidate, whichever is smaller;
- a seventh function to perform reduction of the charging current value in response to the temperature detected by the detection circuit having become higher than or equal to the detection threshold set; and
- an eighth function to cancel the reduction of the charging current value in response to the temperature detected by the detection circuit having become lower than the cancel threshold set, subsequent to performing the reduction of the charging current value.

2. A charger comprising:
a first connection portion configured to be connected to an external power supply, the external power supply outputting a first electric power;
a second connection portion configured to be connected to a battery;
a power-supply circuit including a heat-generating component, the power-supply circuit being configured to (i) generate a second electric power from the first electric power inputted through the first connection portion and (ii) output the second electric power through the second connection portion;
an integration circuit configured to calculate an integrated capacity during a period in which the first connection portion is electrically connected to the external power supply, the integrated capacity corresponding to a value obtained by integrating an amount of current into a predetermined initial value, the amount of current being based on a value of a charging current outputted from the second connection portion;
a storage device storing a first correspondence data, the first correspondence data indicating a correspondence relationship between a battery capacity and a first temperature threshold;
a first calculation circuit configured to, at a start of charging the battery, calculate a first detection threshold candidate based on the first correspondence data stored in the storage device, the first detection threshold candidate corresponding to the first temperature threshold that is calculated, with the integrated capacity assigned to the battery capacity, based on the first correspondence data;
a threshold setting circuit configured to, at the start of charging the battery, set a detection threshold to the first detection threshold candidate calculated by the first calculation circuit;
a detection circuit configured to detect a temperature of the heat-generating component; and
a reduction circuit configured to perform reduction of the charging current value in response to the temperature detected by the detection circuit having become higher than or equal to the detection threshold set by the threshold setting circuit.

3. The charger according to claim 2,
wherein the integration circuit is configured to subtract a specified value from the integrated capacity in response to a value of the charging current being smaller than a current threshold during a period in which the first connection portion is electrically connected to the external power supply.

4. The charger according to claim 2,
wherein the battery has a nominal capacity,
wherein the charger further includes:
- a capacity acquisition circuit configured to acquire a capacity data indicating the nominal capacity; and
- a second calculation circuit configured to calculate a second detection threshold candidate based on the first correspondence data stored in the storage device, the second detection threshold candidate corresponding to the first temperature threshold that is calculated, with the capacity data assigned to the battery capacity, based on the first correspondence data, and wherein the threshold setting circuit is configured to set the detection threshold to the first detection threshold candidate or the second detection threshold candidate, whichever is smaller.

5. The charger according to claim 4,
wherein the storage device further stores a second correspondence data, the second correspondence data indicating a correspondence relationship between the battery capacity and a second temperature threshold, the second temperature threshold being smaller than the first temperature threshold,
wherein the first calculation circuit is configured to, at the start of charging the battery, further calculate a first cancel threshold candidate based on the second correspondence data stored in the storage device, the first cancel threshold candidate corresponding to the second temperature threshold that is calculated, with the integrated capacity assigned to the battery capacity, based on the second correspondence data, wherein the second calculation circuit is configured to further calculate a second cancel threshold candidate based on the second correspondence data stored in the storage device, the second cancel threshold candidate corresponding to the second temperature threshold that is calculated, with the capacity data assigned to the battery capacity, based on the second correspondence data, wherein the threshold setting circuit is configured to further set, at the start of charging the battery, a cancel threshold to the first cancel threshold candidate or the second cancel threshold candidate, whichever is smaller, and wherein the reduction circuit is configured to cancel the reduction of the charging current value in response to the temperature detected by the detection circuit having become lower than the cancel threshold set by the threshold setting circuit, subsequent to performing the reduction of the charging current value.

6. The charger according to claim 5, wherein the reduction circuit is configured to, at the start of charging the battery, perform the reduction of the charging current value if the temperature detected by the detection circuit is higher than or equal to the cancel threshold set by the threshold setting circuit.

7. The charger according to claim 2, wherein the integration circuit is configured to calculate the integrated capacity in a process cycle, the process cycle repeating, and wherein the amount of current corresponds to a value obtained by multiplying the charging current value at a time of calculating the integrated capacity by the process cycle.

8. The charger according to claim 2, wherein the heat-generating component is arranged in a vicinity of a first component, the first component having a speed of temperature rise that depends on a magnitude of a capacity of the battery.

9. The charger according to claim 2, further comprising:

a current acquisition circuit configured to acquire a demanded current value from the battery during charging of the battery, wherein the power-supply circuit is configured to output, through the second connection portion, a charging current having a value based on the demanded current value acquired by the current acquisition circuit, and wherein, the reduction circuit is configured to, in response to (i) the temperature detected by the detection circuit having become higher than or equal to the detection threshold set by the threshold setting circuit and (ii) the demanded current value acquired by the current acquisition circuit being larger than or equal to a reduced current value, cause a charging current of the reduced current value to be outputted.

10. A method for charging a battery by a charger, the method comprising:

receiving a first electric power from an external power supply through a first connection portion of the charger;

generating a second electric power from the first electric power;

outputting the second electric power generated, to the battery connected to a second connection portion of the charger;

calculating an integrated capacity during a period in which the first connection portion is electrically connected to the external power supply, the integrated capacity corresponding to a value obtained by integrating an amount of current into a predetermined initial value, and the amount of current being based on a value of a charging current outputted from the second connection portion;

calculating a first detection threshold candidate based on a first correspondence data, the first correspondence data (i) indicating a correspondence relationship between a battery capacity and a first temperature threshold and (ii) being stored in a storage device of the charger, the first detection threshold candidate corresponding to the first temperature threshold that is calculated, with the integrated capacity assigned to the battery capacity, based on the first correspondence data;

setting a detection threshold to the first detection threshold candidate calculated, at a start of charging the battery;

detecting a temperature of a heat-generating component included in the charger; and reducing the charging current value in response to the temperature detected having become higher than or equal to the detection threshold set.

* * * * *